(12) United States Patent
Nouri et al.

(10) Patent No.: US 11,049,724 B2
(45) Date of Patent: Jun. 29, 2021

(54) METHOD FOR PRODUCING PATTERNS IN A SUBSTRATE

(71) Applicant: COMMISSARIAT A L'ENERGIE ATOMIQUE ET AUX ENERGIES ALTERNATIVES, Paris (FR)

(72) Inventors: Lamia Nouri, Grenoble (FR); Frederic-Xavier Gaillard, Voiron (FR); Stefan Landis, Tullins (FR); Nicolas Posseme, Sassenage (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/616,275

(22) PCT Filed: May 24, 2018

(86) PCT No.: PCT/EP2018/063742
§ 371 (c)(1),
(2) Date: Nov. 22, 2019

(87) PCT Pub. No.: WO2018/215635
PCT Pub. Date: Nov. 29, 2018

(65) Prior Publication Data
US 2020/0090941 A1    Mar. 19, 2020

(30) Foreign Application Priority Data

May 24, 2017    (FR) ...................................... 1754648

(51) Int. Cl.
*H01L 21/3063*    (2006.01)
*H01L 21/265*    (2006.01)
(Continued)

(52) U.S. Cl.
CPC ........ *H01L 21/3063* (2013.01); *H01L 21/266* (2013.01); *H01L 21/26506* (2013.01); *H01L 21/30604* (2013.01)

(58) Field of Classification Search
None
See application file for complete search history.

(56) References Cited

U.S. PATENT DOCUMENTS 6,617,191 B1    9/2003  Iwata et al.
6,790,340 B1    9/2004  Izuo et al.
(Continued)

FOREIGN PATENT DOCUMENTS

WO    WO 2016/102609 A1    6/2016

OTHER PUBLICATIONS

International Search Report dated Aug. 10, 2018 in PCT/EP2018/063742, citing documents AA-AD, AO, and AV-AX therein, 3 pages.

(Continued)

*Primary Examiner* — Stephanie P Duclair
(74) *Attorney, Agent, or Firm* — Oblon, McClelland, Maier & Neustadt, L.L.P.

(57) ABSTRACT

A method for producing at least one pattern in a substrate is provided, including providing a substrate having a front face surmounted by at least one masking layer carrying at least one mask pattern, carrying out an ion implantation of the substrate so as to form at least one first zone having a resistivity ρ1 less than a resistivity ρ2 of at least one second non-modified zone, after the ion implantation step, immersing the substrate in an electrolyte, and removing the at least one first zone selectively at the at least one second zone, the removing including at least an application of an electro- (Continued)

chemistry step to the substrate to cause a porosification of the at least one first zone selectively at the at least one second zone.

25 Claims, 5 Drawing Sheets

(51) Int. Cl.
  *H01L 21/266* (2006.01)
  *H01L 21/306* (2006.01)

(56) References Cited

U.S. PATENT DOCUMENTS

| | | | |
|---|---|---|---|
| 2013/0284697 A1* | 10/2013 | England | G03F 7/0002 216/47 |
| 2017/0363954 A1 | 12/2017 | Landis et al. | |
| 2017/0372904 A1 | 12/2017 | Landis et al. | |

OTHER PUBLICATIONS

Teo, E.J. et al. "Fabrication of silicon microstructures using a high energy ion beam" Proceedings of SPIE—The International Society for Optical Engineering, vol. 5347, No. 1, XP002783440, 2004, 8 pages.

Jakubowicz, J. "Nanoporous silicon fabricated at different illumination and electrochemical conditions" Superlattices and Microstructures, vol. 41, No. 4, XP022090546, 2007, 12 pages.

Menzel, F. et al. "Fabrication of microstructures in III-V semiconductors by proton beam writing" Nuclear Instruments and Methods in Physics Research B, vol. 267, XP026157217, 2009, 6 pages.

\* cited by examiner

METHOD FOR PRODUCING PATTERNS IN A SUBSTRATE

TECHNICAL FIELD OF THE INVENTION

The invention generally relates to microelectronic methods for producing, on the front face of a substrate, possibly complex two-dimensional (2D) or three-dimensional (3D) patterns.

It has particularly advantageous, but non-limiting applications, in the structuring of the surface of a substrate to produce microelectronic, electronic, micromechanical, electromechanical (MEMS, NEMS, etc.), microfluidic, optical or optoelectronic devices.

STATE OF THE ART

There are numerous solutions to obtain two-dimensional (2D) or three-dimensional (3D) patterns on the front face of a substrate. All known solutions have limitations or disadvantages.

The most conventional solution to structure the front face of a substrate by forming patterns, in particular two-dimensional patterns, consists of producing, for example, by lithography, a prior pattern in a masking layer surmounting a substrate, then to carry out a wet etching of the substrate through the masking layer. The disadvantage of this solution mainly arises from the isotropic character of wet etching, which leads to a low dimensional control.

Other more recent solutions consist of carrying out plasma etchings. Inductively coupled plasma (ICP) equipment has made it possible to significantly improve the anisotropy of the etching and the etching selectivity for certain materials. However, the ions of the plasma, due to the significant energy thereof (rarely less than fifteen eV), often penetrate a deeper depth that that sought to be etched. Moreover, it is often very difficult to precisely control the nature of the species implanted. Indeed, the ion bombardment obtains atoms from all the layers subjected to the plasma and these atoms obtained can penetrate into the layer to be etched or into the layers underlying the substrate when the latter is thin. This can cause a contamination of the substrate or of the layers underlying the substrate.

Moreover, it proves to be that during the plasma etching of charges are accumulated at the top and bottom of the patterns. These charges deviate the paths of the ions and ultimately damage the dimensional control of the patterns, as well as the verticality of the edges.

Other types of plasma have been proposed to limit the disadvantages mentioned above. In particular, pulsed plasmas have been developed to minimise the damage of the underlying layers, when the substrate is very thin. However, the pulsed plasmas do not make it possible to totally remove this damage. Moreover, the etching speeds of these pulsed plasmas are low, which makes the industrialisation thereof problematic or limited to certain applications only.

Another solution undergoing development consists of carrying out an atomic layer etching (ALE). This type of etching consists of modifying a first atomic layer of a material during a self-limiting step, then of removing this layer during a second step, without damaging the underlying material. The process is repeated cyclically to achieve the desired thickness. Thus, the atomic layer etching has the advantage of reducing the damage of the layers underlying the substrate that are wanted to be etched. However, this solution has the major disadvantage, that the etching speed obtained is too low for an industrial application.

An aim of the present invention is therefore to propose a solution to limit, even avoid, the disadvantages of at least some of the known solutions to structure, in thickness, the front face of a substrate.

In particular, an aim of the present invention is to propose a solution to structure the front face of a substrate by producing patterns in relatively free and complex forms, with an acceptable dimensional control and an etching speed compatible with industrial constraints.

Another aim of the present invention is to propose a solution for producing, on the front face of a substrate, a structuring formed of patterns of which the material has the same properties as the initial properties of the substrate, i.e. the properties that the substrate had at the start of the method.

Other aims, features and advantages of the present invention will appear upon examining the following description and the supporting drawings. It is understood, that other advantages can be incorporated.

SUMMARY OF THE INVENTION

To achieve this aim, according to an embodiment, the present invention provides a method for producing at least one pattern in a substrate, the method comprising at least the following steps:
  providing a substrate having a front face surmounted by at least one masking layer,
  defining at least one mask pattern in the masking layer,
  producing an ion implantation of the substrate by said front face and at least upright of the mask pattern, so as to form at least one first zone modified by implantation and at least one second zone not modified by implantation or less modified than the first zone, the implantation conditions being selected such that after implantation, the at least one first zone has a resistivity $\rho1$ less than the resistivity $\rho2$ of the at least one second zone.

The method further comprises at least the following successive steps:
  after the implantation step, immersing, preferably fully, the substrate in an electrolyte,
  removing the at least one first zone selectively to the at least one second zone, the removal step comprising at least the application to the substrate of an electrochemistry step to cause a porosification of the at least one first zone selectively to the at least one second zone, the removal step being carried out such that at least during the electrochemistry step, at least one rear face of the substrate opposite the front face has charge carriers.

Thus, in the method according to the invention, the implantation locally creates defects in the material of the substrate, with the aim of reducing the resistivity thereof. This makes it possible to facilitate the movement of the charge carriers during the porosification. Thus, the porosification is carried out only in the implanted zones. At the very least, the porosification is carried out more rapidly in the implanted zones than in the non-implanted zones.

Thus, from the removal step, the front face of the substrate is found to be etched at the level of the at least one first zone. The masking patterns defined beforehand in the masking layer are therefore transferred into the substrate.

The method according to the invention makes it possible to obtain a structuring of the front face of a substrate with a very good dimensional control. Moreover, the wall of the patterns is defined by the direction(s) selected for the implantation. The geometry of the edges of the patterns is therefore controlled precisely. In particular, the method according to the invention makes it possible to obtain vertical edges easily and reproducibly.

Furthermore, in the method claimed, the nature of the ions which penetrate into the substrate during the implantation is perfectly controlled. Thus, if some of the ions penetrate into a layer underlying the substrate that is desired to be etched, the nature of these ions implanted unintentionally will be perfectly controlled. It will thus be advantageous to implant neutral ions, in order to avoid a contamination of the underlying layer. On the contrary, in plasma etching methods, it is very difficult to control precisely the nature of the ions which actually penetrate into the substrate that is wanted to be etched and the layer which itself is underlying. This results in a damaging, even a contamination of the underlying layer.

Moreover, the ions implanted during the implantation step have the aim of modifying the resistivity of the substrate. They do not have the aim of spraying the substrate. Consequently, the energy from the ions which travel over the substrate is limited. Thus, with respect to the plasma etchings, the invention has the advantage of avoiding damaging the layers underlying the substrate.

Furthermore, the step of removal by electrochemical etching provided in the invention is carried out at a perfectly compatible speed with industrial constraints. For example, the method according to the invention makes it possible to etch between 100 and 200 nanometres of silicon in 30 seconds, which makes it possible for a productivity very broadly greater than that of an atomic layer etching (ALE) method.

Moreover, the method according to the invention has the advantage of being stable and easily reproducible.

Particularly advantageously, coming from the method, the patterns obtained are formed by zones of the substrate which have not been implanted, or which have been hardly implanted. The patterns obtained therefore have the properties that the material of the substrate has before implantation. In particular, if the substrate is made of a semi-conductive material, the patterns formed in the substrate will have the same semi-conductive properties. Typically, the final patterns will be made of intrinsic silicon, if the starting substrate is also made of intrinsic silicon.

The method according to the present invention has particularly advantageous, but non-limiting applications, in the structuring in thickness of the front face of a substrate to produce microelectronic, electronic, micromechanical, electromechanical (MEMS, NEMS, etc.), microfluidic, optical or optoelectronic devices.

BRIEF DESCRIPTION OF THE FIGURES

The aims, objectives, as well as the features and advantages of the invention will best emerge from the detailed description of embodiments of the latter, which are illustrated by the following supporting drawings, wherein.

Figure 1A:
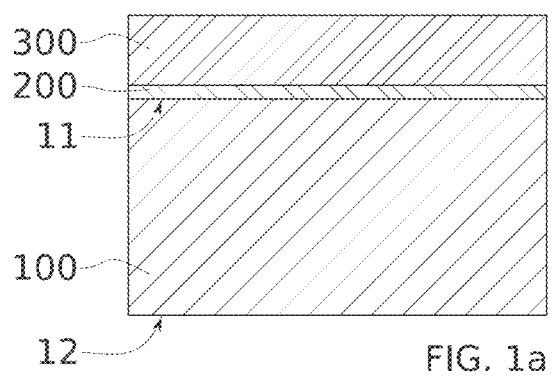
FIG. 1 composed of FIGS. 1a to 1f, illustrates the steps of an embodiment of the present invention.

The drawings are given as examples and are not limiting of the invention. They constitute schematic representations of principle intended to facilitate the understanding of the invention and are not necessarily to the scale of practical applications. In particular, the relative thicknesses of the different layers and of the patterns are not representative of reality.

DETAILED DESCRIPTION OF THE INVENTION

In the scope of the present application, it is considered that a layer, for example forming a substrate, is porous when the vacuum in the layer is greater than 5% and preferably between 5 and 50% and preferably between 5 and 10%.

In the scope of the present invention, a pattern having a profile having at least two discreet height levels, or which has an analogue profile with a continuous variation of tangents of the shape of the profile is designated by three-dimensional pattern.

Thus, a 3D pattern has, in a given layer, for example a resin or a substrate, at least two levels of depth below the upper face of the layer when the pattern is hollow or at least two height levels above an upper face of the layer when the pattern is protruding. This appears clearly in FIGS. 5a to 5d and 8a to 8d, for example which will be described in detail below.

In the scope of the present invention, an organic or organo-mineral material, which could be shaped by an exposure to an electron, photon or X-ray beam, or mechanically, is qualified as a resin.

It is specified that, in the scope of the present invention, the thickness of a layer or of the substrate is measured along a direction perpendicular to the surface according to which this layer or this substrate has the maximum extension thereof. In the figures, the substrate forms a plate extending mainly in a horizontal plane and the thickness is taken along the vertical.

Likewise, when it is indicated that an element is situated to the right of another element, this means that these two elements are both situated on one same line perpendicular to the main plane of the substrate, that is on one same line oriented vertically in the figures.

It is specified that, in the scope of the present invention, the terms "on", "surmounts", "covers", "underlying" and the equivalents thereof do not necessarily mean "in contact with". Thus, for example, the extension, the adhesion, the assembly, the application or the deposition of a first layer on a second layer, does not compulsorily mean that the two layers are directly in contact with one another, but means that the first layer covers at least partially the second layer by being either directly in contact with it, or by being separated from it by at least one other layer or at least other element.

A layer can moreover be composed of several sublayers of one same material or of different materials.

Using the singular for certain elements of the invention does not compulsorily mean that a given element is present only in the invention. The word "a" or "an" does not therefore exclusively mean respectively "a single" or "one single", unless it is arranged in the invention otherwise.

By a material A-"based" substrate or a film or a layer, this means a substrate, a film, a layer comprising this material A and possibly other materials, for example doping elements.

Before starting a detailed review of embodiments of the invention, below are stated optional features which can possibly be used in association with or alternatively:

According to an embodiment, the implantation is carried out such that $\rho 2 \geq 1.1*\rho 1$, preferably such that $\rho 2 \geq 2*\rho 1$, preferably such that $\rho 2 \geq 3*\rho 1$.

For example, the resistivities $\rho 1$ and $\rho 2$ will be determined by the SSRM (Scanning Spreading Resistance Microscopy) method, well-known to a person skilled in the art.

According to an embodiment, the electrochemistry step is carried out so as to create a porosification of the at least one first zone.

According to an embodiment, the electrochemistry step is carried out, such that said porosification of the modified zones leads to the consumption thereof during the method.

Thus, the advantage of this embodiment is that the electrochemistry step, due to the porosification, undergoes removing the modified zones selectively from the non-modified zones. The substrate removed from the electrolyte thus has the final patterns.

The advantage of this embodiment and that the implantation can be done with all types of ions. In particular, neutral ions such as argon ions will be favoured.

According to another embodiment, the electrochemistry step is carried out such that said porosification of the modified zones does not lead to the consumption of the at least one first zone with respect to the at least one second zone and the removal step also comprises, after the electrochemistry step, a step of etching the at least one first zone made porous selectively at the at least one second zone.

According to an embodiment, the ions implanted during the implantation are ions, of which the atomic mass is greater than or equal to that of boron. This embodiment has the advantage that with this type of atomic mass, the detachment of the portion implanted is carried out very easily even systematic. Typically when there is no buffer layer capable of preventing the formation of a carbonaceous layer on the surface of the substrate, doses greater than 1.E21 atoms/cm$^3$, make it possible to obtain a detachment of the implanted layer. When there is a buffer layer, doses greater than 1.E19 atoms/cm$^3$ make it possible to obtain an easy, even systematic detachment of the implanted layer.

The implanted ions are, for example, taken from among the following ions: boron or argon.

According to an embodiment, the ions implanted during the implantation are taken from among hydrogen (H)-based ions and helium (He)-based ions.

According to an embodiment, the ion implantation of the substrate is carried out such that the ions are implanted with an energy less than or equal to 150 keV.

In particular, when the implanted ions are hydrogen or helium ions, this makes it possible to effectively reduce the resistivity of the substrate.

According to an embodiment, the removal step comprises a selective wet etching of the at least one first zone made porous selectively at the at least one second zone.

According to an embodiment, wet etching is carried out in an alkaline environment with, for example, potassium hydroxide (KOH) or tetramethylammonium hydroxide (TMAH).

This step can be carried out in combination with each of the embodiments of the invention. It makes it possible to remove the whole modified zone if the latter remains fully integral with the substrate after having been made porous. This step can also make it possible to remove possible residual portions of porous zones which would not be detached, while a portion of the porous zones is detached from the substrate.

According to another embodiment combining the two preceding embodiments, said ion implantation of the substrate is carried out so as to form several first zones modified by implantation, and electrochemistry step is carried out such that said porosification of the modified zones:
  leads to a complete detachment of only some from among the first zones, with respect to the at least one second zone,
  does not lead to a complete detachment of the other first zones, with respect to the at least one second zone and the removal step also comprises, after the electrochemistry step, a step of etching said other first zones.

Thus, the electrochemistry step is carried out such that some modified zones are detached from themselves. Moreover, an etching step is applied, identical to that mentioned above, to remove said other modified zones which are not detached from themselves.

According to an embodiment, the removal step comprises an illumination of the rear face of the substrate such that the rear face of the substrate has charge carriers during the electrochemistry step.

According to an embodiment, the illumination is carried out during the electrochemistry step.

According to an embodiment, alternative or combined with the embodiment comprising an illumination, the method comprises, before the step of immersing the substrate in the electrolyte, a doping step (typically a p+ doping) of the rear face such that the rear face of the substrate has charge carriers during the electrochemistry step.

According to an embodiment, the masking layer is a resin layer, and the step of defining at least one mask patter in the masking layer comprises at least one from among: an optical lithography, an electronic lithography, a nano-printing lithography, a direct self-assembled (DSA) method.

According to an embodiment, during the implantation step, the substrate is surmounted on a buffer layer situated between the front face of the substrate and the masking layer.

According to a preferred variant of this embodiment, the masking layer comprises carbon atoms. It is thus a carbonaceous layer, like for example a resin layer. The buffer layer is shaped, in particular the thickness thereof and the material thereof, so as to trap the carbon atoms which would be obtained from the masking layer during the ion implantation. Thus, these obtained carbon atoms are found trapped in the buffer layer and do not penetrate into the substrate, which therefore does not find itself altered.

According to an embodiment, the masking layer is in direct contact with the substrate. According to another embodiment, the buffer layer is in direct contact with the substrate. Preferably, the buffer layer is in direct contact with the masking layer. The embodiment with buffer layer has the advantage of protecting the substrate from a contamination by species of the masking layer during the implantation. In particular, when the masking layer is a carbonaceous layer, the carbon atoms can, during the implantation, be obtained from the masking layer and penetrate into the substrate. These carbon atoms can thus form, on the surface of the substrate, a thin carbonaceous layer, which resists the porosification. With this embodiment of the present invention, before the step of removal by electrochemistry, the thin carbon layer is removed from the substrate, which makes it possible for the porosification to be carried out effectively.

Advantageously, the method comprises, before the immersion step and the removal step, a step of removing the buffer layer.

According to an embodiment, the method comprises, before the immersion step and the removal step, a step of removing the masking layer.

Preferably, any other layer covering the latter, for example a buffer layer, is also removed from the front face of the substrate.

Thus, the front face of the substrate is fully stripped before the step of immersing the substrate.

According to an embodiment, the step of immersing the substrate is carried out such that both the front face and the rear face of the substrate are in contact, preferably simultaneously, with the electrolyte.

According to an embodiment, the masking layer comprises several height levels. The masking layer comprises adjacent regions having different height levels.

According to an example, a height level can be non-zero and a height level can be zero. The masking layer therefore has two-dimensional patterns. For example, the step of defining the at least one mask pattern in the masking layer is produced such that the masking layer comprises at least one first region having a non-zero height level and at least one second region, adjacent to the first region and having a zero height level.

According to another example, the two adjacent regions have different and non-zero height levels. The masking layer therefore has three-dimensional patterns. For example, the step of defining the at least one mask pattern in the masking layer is produced such that the masking layer comprises at least one first region having a first non-zero height level and at least one second region, adjacent to the first region and having a second height level, non-zero and different from the first height level. Thus, the masking level comprises several (different and) non-zero height levels.

According to an example, the masking layer is shaped and the ion implantation is carried out, so as to form, in the substrate, at least two first adjacent zones and having different and non-zero implantation depths. Thus, said first adjacent zones form a three-dimensional pattern.

According to an embodiment, on the front face of the same substrate, three-dimensional patterns and two-dimensional patterns can be had.

According to an example, the step of removing the at least one first zone selectively at the at least one second zone is carried out so as to form on the front face of the substrate, at least one function pattern of the mask pattern. The mask pattern is the pattern formed in the substrate can be isometric or not. They are, for example, proportional.

According to an example, the material of the masking layer and the material of the substrate are selected such that the penetration of the ions within these materials makes it possible for said pattern formed on the front face of the substrate coming from the removal step is identical (i.e. that it has identical shapes and dimensions) to said mask pattern, or that it is different while having dimensions proportional to those of the mask pattern.

According to an embodiment, the substrate is made of a semi-conductive material.

According to an embodiment, the substrate is silicon (S)-based and preferably is made only of silicon. According to an embodiment, the substrate is preferably monocrystalline.

According to an embodiment, during the electrochemistry step, a constant intensity is maintained of the current passing between an anode formed partially at least by the substrate and a cathode immersed in the electrolysis, the evolution of the voltage between the anode and the cathode is monitored. This voltage evolves during anodisation. When it is stabilised, this means that all of the at least one first zone has been made porous.

Thus, it is possible to precisely control that the at least one first zone modified during the implantation has been made porous. The electrolysis step can thus be interrupted.

An embodiment example of the present invention will now be described in reference to FIGS. 1a to 1f.

As illustrated in FIG. 1a, a stack comprising a substrate 100 having a rear face 12 and a front face 11 is produced, the front face 11 being covered by a masking layer 300. Optionally, but advantageously, at least one buffer layer 200 is provided between the substrate 100 and the masking layer 300.

Typically, the substrate 100 is made of a semi-conductive material. It is preferably made of a silicon-based material, for example, monocrystalline or polycrystalline.

The masking layer 300 can either be a resin layer, or a hard mask, for example, a nitride mask.

The masking layer 300 can be a monolithic layer. Alternatively, it can be formed of a stack of several films.

Likewise, the buffer layer 200 can be a monolithic layer or, alternatively, be formed of a stack of several films. The buffer layer 200 is, for example, made of an oxide or of a nitride of the material constituting the substrate. Typically, it is a silicon oxide (SixOy) such as SiO2 or a silicon nitride (SixNy) such as SiN. It has, for example, a thickness of between 10 and 20 nanometres.

Figure 1B:
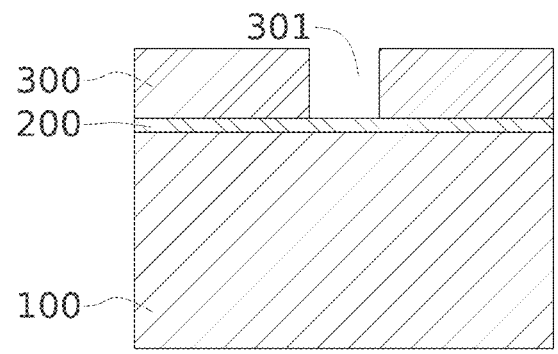

As illustrated in FIG. 1b, in the masking layer 300, at least one pattern 301, called masking pattern, is produced. This pattern 301 can be produced by any conventional lithographic means: optical lithography, electronic lithography, nano-printing lithography. It can also be produced by the direct self-assembled (DSA) technique. In the embodiment illustrated in FIG. 1b, the pattern 301 informs a cavity and the whole thickness of the masking layer 300 is removed at the level of the masking pattern 301. According to another embodiment, a residual thickness of the masking layer 300 subsisted in the bottom of the masking pattern 301. Such would in particular be the case if the pattern 301 is obtained by nano-printing.

In the example illustrated in FIG. 1b, the mask pattern 301 has two adjacent regions of different heights, the height (here corresponding to the thickness) being taken along a direction perpendicular to the main plane wherein extends the substrate 100. One of these heights is zero (cavity of the pattern 301) and the other of these heights is non-zero. The barrier between these two adjacent regions is the vertical edge of the pattern 301. Thus, the mask pattern 301 is a two-dimensional pattern.

Figure 1C:
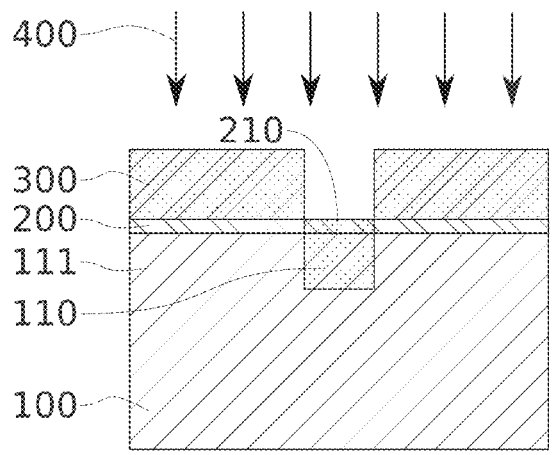

FIG. 1c illustrates a step of localised modification of the substrate 100. This modification is carried out by an ion implantation of the substrate 100 by the front face 11 thereof and at least to the right of the masking pattern 301. This implantation is carried out through the masking layer 300 and through the buffer layer 200 if it is present. In this example, the favoured direction of implantation is perpendicular to the main plane wherein extends the substrate 100 (this direction is vertical in the figures illustrated). The thickness of the masking layer 300, the thickness of the buffer layer 200, as well as the implantation conditions, in particular, the energy communicated to the ions and the direction of implantation, are selected such that at least to the right of the pattern 301 of the ions penetrate into the substrate 300. They thus modify a zone 110 of the substrate 100. The remainder of the substrate 100, i.e. the substrate portions which are not modified by the implantation or which are modified below a given threshold, are referenced 111 in the figures.

The implantation can be carried out by any conventional means used to implant ions in a material. Thus, an implanter can be resorted to. These ions from a plasma can also be provided to be implanted.

Advantageously, the buffer layer 200 aims to avoid, under the effect of ion bombardment, atoms of the masking layer 300 being obtained from the latter and penetrate into the substrate 100.

In particular, when the masking layer 300 is a carbonaceous resin, the ion bombardment can lead to obtaining the carbon atoms from this masking layer 300 and to making them penetrate into the substrate 100 if the latter is not covered by a buffer layer 200. In the absence of a buffer layer 200, a carbonaceous film can thus be formed on the surface of the front face 11 of the substrate 100. This carbonaceous film could thus prevent the porosification that is sought to be caused during the following electrochemistry step.

By correctly sizing the thickness of the buffer layer 200 according to the implantation energy of the ions and according to a possible residual layer in the bottom of the patterns 301 of the masking layer 300, all the carbon atoms which could potentially be obtained from the masking layer 300 and which would be directed towards the substrate 100 can be trapped within the layer 200. The front face 11 of the substrate 100 is thus an example of any contamination and the formation of a carbonaceous film is avoided. The portion of the buffer layer 200 within which the atoms obtained from the masking layer 300 are found trapped, is referenced 210 in FIG. 1c.

As will be illustrated, for example, in the embodiments of FIGS. 5, 6 and 8, this buffer layer 200 is only optional.

Naturally, it can be that ions penetrate unintentionally into the substrate 100 in zones where it was not desired for them to penetrate, in particular at the barrier between the zones 110 and the zones 111. Thus, generally, the zones 111 are zones not implanted or having a lower concentration of ions implanted than in the zones 110. To be brief, in the description below, the zones 111 are qualified by zones not implanted, that these zones actually receive no ions, or that they receive hardly any of them.

The implantation is carried out, such that the resistivity $\rho1$ of the implanted zones 110 is less than the resistivity $\rho2$ of the zones 111 not implanted. More specifically, the implantation conditions, in particular the nature of the implanted ions and the implanted dose are such that $\rho2 \geq 1.1*\rho1$ and preferably $\rho2 \geq 2*\rho1$ and preferably $\rho2 \geq 3*\rho1$.

In the scope of the present invention, the resistivities $\rho1$ and $\rho2$ will be, for example, determined by the scanning spreading resistance microscopy (SSRM) method, well-known to a person skilled in the art.

In order to obtain, in the modified zones 110, a resistivity $\rho1$ having a desired value, a person skilled in the art will in particular play on the nature of the ions, the implantation dose and in particular, the implantation energy.

A high-energy implantation of light ions can lead to an increase in resistivity, which goes against the aim sought. In particular, for a silicon substrate and for a helium- or hydrogen-based implantation, the maximum energy is 150 keV.

A person skilled in the art will know how to adapt the implantation conditions, in particular the implantation energy such that the implantation actually leads to a reduction in resistivity and not to the increase thereof.

Thus, the implantation aims to locally create defects in the material of the substrate 100, in order to locally reduce the resistivity thereof. The regions of which the resistivity is reduced, correspond to the modified zones 110. These regions with reduced resistivity have a geometry, identical to that of the masking patterns 301 produced in the masking layer 300. At the very least, these regions with reduced resistivity have a geometry which is according to that of the masking patterns 301 produced in the masking layer 300.

Thus, it can be considered, that the substrate 100 has a first modified zone 110, of which the depth is non-zero and a second non-modified or modified zone 111 over a zero depth. This first zone 110 therefore forms a two-dimensional pattern.

Figure 1D:
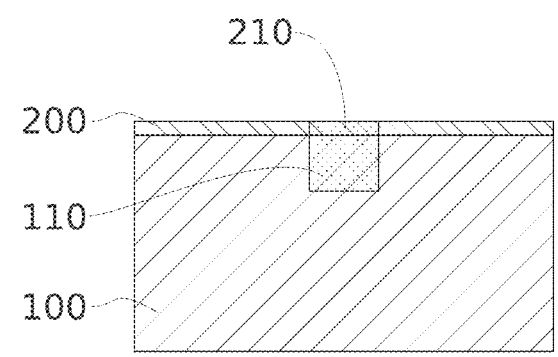
Figure 1E:
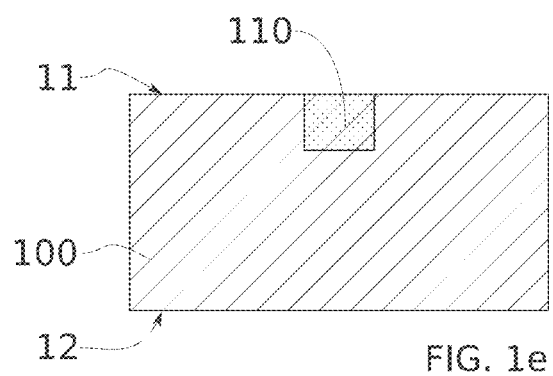

As illustrated in FIGS. 1d and 1e, the masking layer 300 and the buffer layer 200 are removed. According to the nature of the materials of these two layers, these removals can be carried out successively, as illustrated in this embodiment or be carried out simultaneously. According to an alternative embodiment, the masking layer 300 can be removed and preserve the buffer layer.

Therefore, in FIG. 1e, a substrate 100 is obtained having at least one zone 110 modified by implantation, of which the resistivity $\rho1$ is lower than that of the initial material of the substrate 100.

Figure 1F:
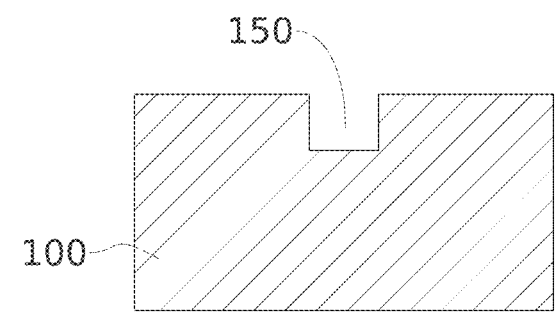

The following step consists of removing the zone 110 selectively at the non-modified zone 111 of the substrate 100 so as to obtain the final result illustrated in FIG. 1f.

For this, an electrochemistry step is provided to be carried out, by immersing the substrate 100 in an electrolyte. The substrate 100 is fully immersed in the electrolyte. Thus, the front face 11 and the rear face 12 of the substrate 100 are in contact with the electrolyte 4.

Figure 2A:
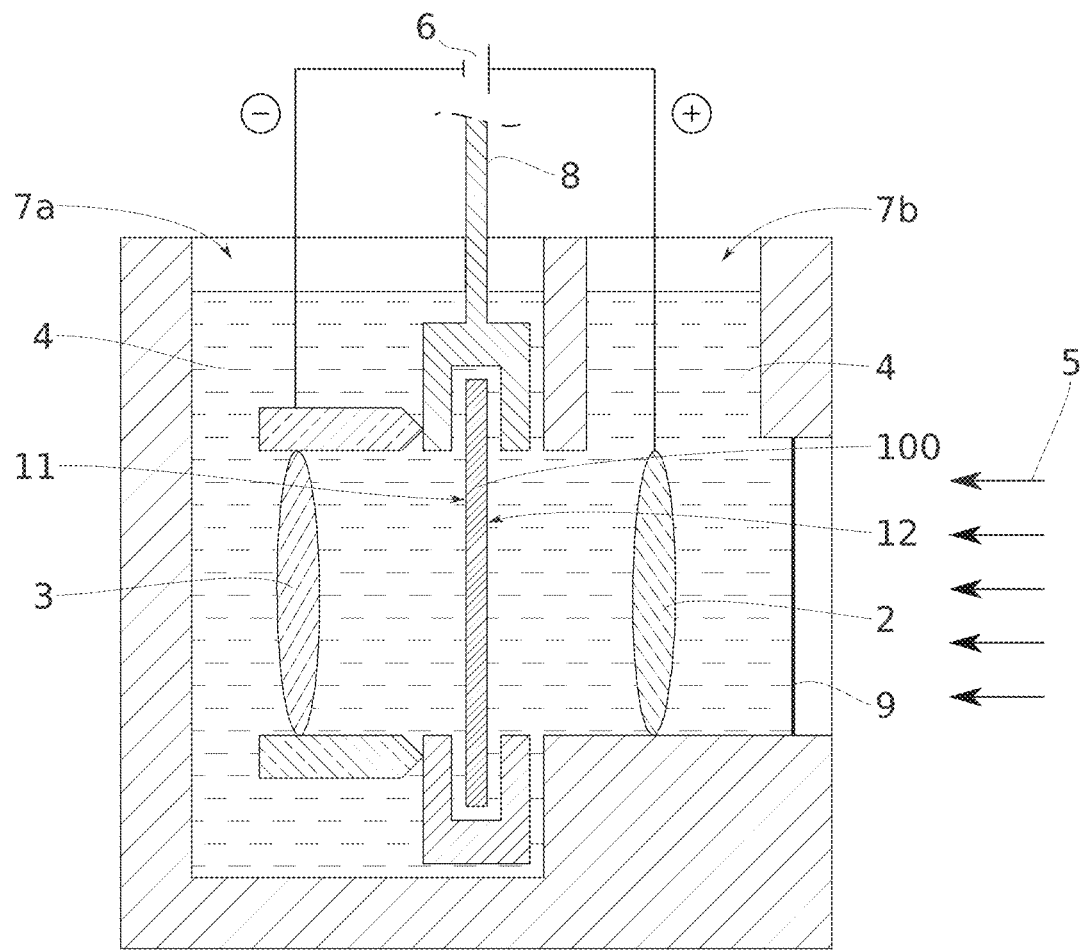
FIGS. 2a and 2b each illustrate an electrochemistry step according to two alternative embodiments, during which the substrate to be etched is immersed in an electrolyte.
Figure 2B:
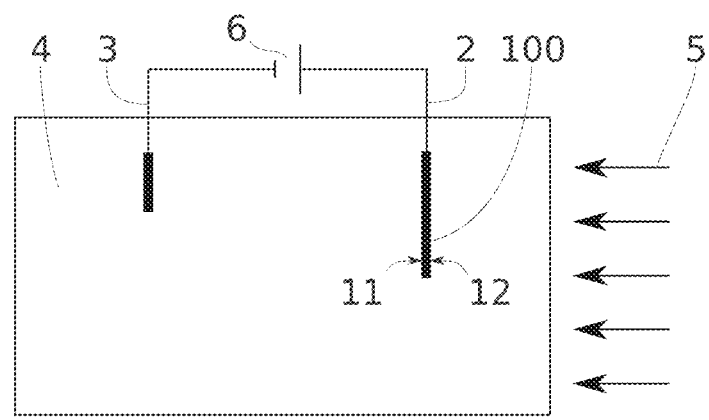

FIGS. 2a and 2b illustrate this electrochemistry step.

Each of FIGS. 2a and 2b illustrates an item of equipment making it possible to carry out this electrochemistry step.

In these non-limiting examples, the substrate 100 is immersed in a hydrofluoric (HF) acid-based electrolyte 4. A current generator 6 is connected to a first electrode (cathode 3) immersed in the electrolyte 4 and to a second electrode (anode 3).

The example of FIG. 2a corresponds to a device usually called a double-cell mounting device. This device comprises two cells each comprising a vessel 7a. 7b. Preferably, the vessels 7a, 7b contain the same electrolyte 4. The vessels 7a, 7b are separated by the plate of substrate 100 to be treated. Advantageously, the substrate 100 ensures the sealing between the two vessels 7a, 7b. It is maintained by a support 8. The anode 3 is immersed in the electrolyte in contact with the rear face 12 of the substrate 100. According to an embodiment, wherein the substrate 100 is illuminated (optional embodiment), the anode 3 lets an illumination pass through. To this end, the anode 3 can have a perimeter and a non-opaque zone, even an opening. It preferably forms a ring and makes it possible for the passage of the illumination in the centre thereof. The anode 3 and the face 12 of the substrate 100 are thus placed facing a non-opaque wall 9 of the vessel 7*b*.

The rear face 12 of the substrate 100 here plays the role of the cathode. The front fact 11 of the substrate 100 is in contact with the electrolyte 4 contained in the other vessel 7*a*. This front face 11 constitutes the face to be treated by porosification. This front face 11 plays the role of the anode.

According to an embodiment example, by using p-type substrates (resistivity $1^{-50}$ ohm·cm), the generation of charge carriers necessary for the porosification by illumination and/or by doping (by ion implantation) on the rear face 12 is favoured.

A person skilled in the art knows how to adapt the conditions according to the nature of the substrates and the experimental device thereof.

In the embodiment illustrated in FIG. 2*b*, the second electrode (anode 3) is electrically connected to the substrate 100. The substrate 100 thus acts as an anode 2. In this embodiment, the two electrodes 3, 4 are immersed in one same vessel comprising the electrolyte.

As illustrated in FIGS. 2*a* and 2*b*:
- a light radiation 5 can be applied at the very least on the rear face 12 of the substrate 100. Whichever the embodiment retained, for example one of those illustrated in FIGS. 2*a* and 2*b*, if an illumination is provided, it can be produced, for example, by a white light. More specifically, the illumination is ensured by an illumination source comprising photons of which the energy is greater than the gap of the material treated, that is, in the case of silicon, an energy greater than 1.1 eV. For example, the power of the lamp is 3500 W. Preferably, the rear face 12 of the substrate 100 is illuminated during the electrochemistry step. According to an advantageous embodiment, the rear face 12 of the substrate 100 is illuminated for the whole duration of the electrochemistry step.
- Alternatively or in a combined manner, it can also be provided to dope the rear face 12 of the substrate. This doping can be carried out after or before the ion implantation. It is carried out before immersing the substrate 100 in the electrolyte 4. This doping can be a p+ type doping. It can, for example, be obtained by two implantation steps, a first step of implanting boron at a dose of $5E15$ atm/cm$^3$ and an energy of 100 keV, then a second step of implanting boron with a dose of $5E15$ atm/cm$^3$ and an energy of 30 keV.

The concentration of carriers on the rear face 12 of the substrate 100, as well as the electrochemical conditions, in particular the current density, are such that the charge carriers on the rear face 12 of the substrate are moved to the front face 11. The movement of the carriers is facilitated in the zones 110 with a lower resistivity. The carriers are therefore directed mainly to these zones 110.

The electrochemical conditions, in particular the nature of the electrolyte 4, are also such that a porosification of the material of the substrate 100 is produced, only in the zones 110. When it is limited to the time necessary to porosify the implanted zones, the selectivity is infinite. Alternatively, the electrochemical conditions are such that the porosification is preferably carried out in the zones 110, i.e. that the porosification is produced at a higher speed in the modified zones 110 than in the non-modified zones 111.

Thus, the aim of the implantation 400 is to create defects localised in the substrate 100, in order to obtain, during the electrochemistry step, a localised porosification.

The energy and the implantation dose make it possible to both define the implantation depth, as well as the defects induced (electrical or morphological) in the material. The amorphisation of the material of the substrate 10, typically of silicon, is not necessary to create the selectivity during the porosification. Indeed, an electrical modification which reduces the resistivity is sufficient. Due to this, all the ions of the periodic table can be used as mentioned above.

FIG. 3 illustrates, in a simplified manner, the porosification mechanism of a silicon substrate 100 in a hydrofluoric (HF) acid-based electrolyte 30. The substrate 100 is surmounted on a dielectric 110 which masks the substrate 100 outside of the openings so as to enable the porosification, only in the non-masked zones.

Figures 3A, 3B, 3C, 3D:
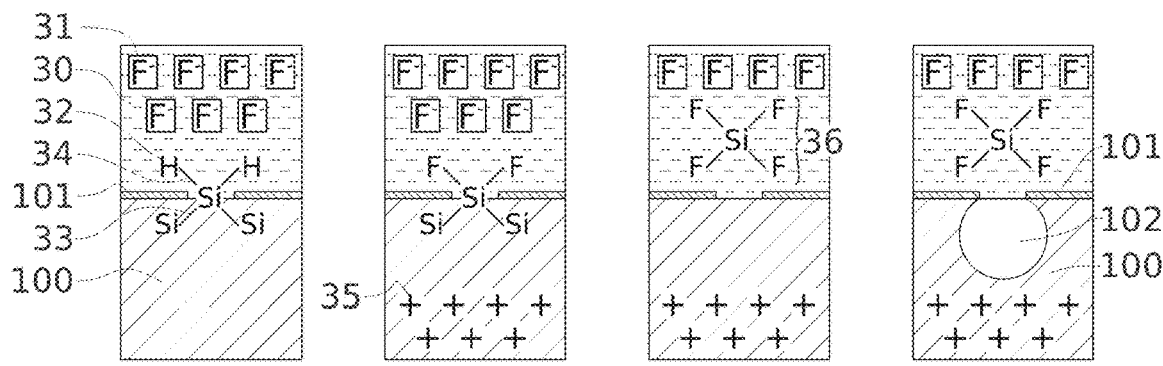
FIG. 3 composed of FIGS. 3a to 3d, illustrates, in a simplified manner, steps of porosificating a silicon layer.

As illustrated in FIG. 3*a*, the dissolution of the Si starts by the passivation of the dangling bonds 34 by the hydrogen atoms 32. Then, the hydrogen atoms 32 are replaced by fluorine atoms 31 (FIG. 3*b*). In FIG. 3*b*, the reference 35 illustrates the movement of the positive charge carriers. The polarisation induced by the Si—F bonds will lead to the breaking of the Si—Si bonds 33 causing, due to this, the clearing of the Si molecule 36 (FIGS. 3*c* and 3*d*). The type and the size of the pores 102 depend on the porosification parameters and of the doping type of the substrate.

More specifically, the parameters making it possible to anodise the material of the substrate 100 and to obtain an effective porosification of the modified zones 110 are as follows:
- the nature of the chemical bath.
- the illumination power. As indicated above, this parameter makes it possible to generate the positive carriers on the rear face 12.
- the density of the anodisation current (A/m$^2$), i.e. the current/surface of the substrate ratio.
- The time during which the current density is applied.

Naturally, these parameters also depend on the initial resistivity of the substrate 100 (i.e. the resistivity of the substrate 100 before the implantation step), of the resistivity of the zones 110 modified by implantation, as well as the depth of the implanted zone 110 that is wanted to be made porous.

According to a first embodiment, the implantation conditions, as well as the parameters of the electrochemistry step are such that the porosification of the zones 110 makes it possible to fully or partially remove at least these zones selectively at the zones 111. The implanted zones 110 are thus fully or at the very least partially detached from the substrate 100. Thus, coming from the electrochemistry step, the substrate 100 no longer comprises material in the zones 110 implanted beforehand or contains less of it than before the anodisation.

Optionally, in this embodiment, preferably a cleaning will be carried out to remove the zones made porous, which would not be detached from the substrate 100. This step therefore acts as cleaning. Alkaline chemistries can be used for this. For example, potassium hydroxide (KOH) or tetramethylammonium hydroxide (TMAH) can be used.

According to a second embodiment, the electrochemistry step leads to a selective porosification of the zones 110 with respect to the zones 111, just like the first preceding embodiment, but in this second embodiment, the zones 110 made porous remain mechanically bound to the substrate 100.

In this case, an etching of the zones made porous selectively at the zones which have not been made porous can be provided. This selective etching can be carried out by a wet etching, for example, using a chemistry comprising a KOH or TMAH base.

In reference to FIG. 5, an embodiment of three-dimensional patterns will now be described.

Figures 5A, 5B:
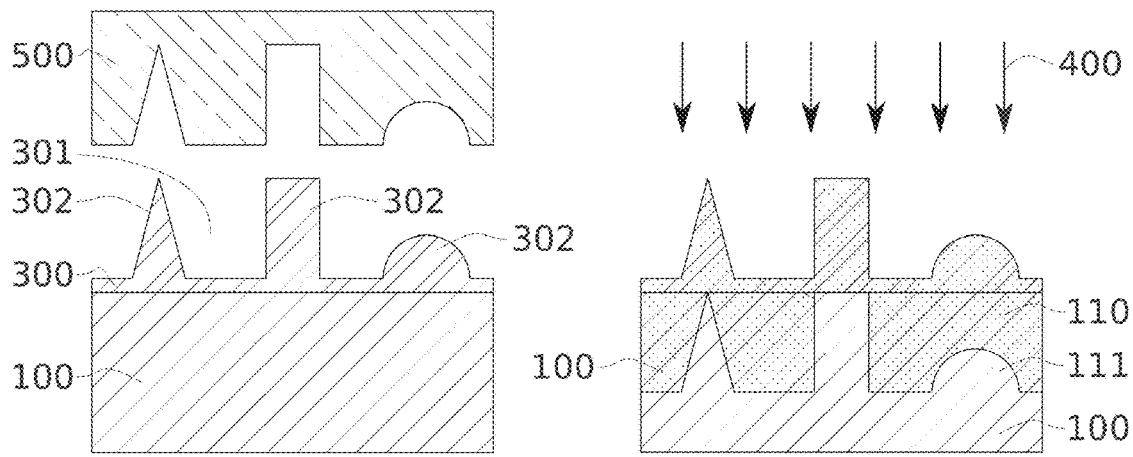
FIG. 5 composed of FIGS. 5a to 5d, illustrates steps of another embodiment of the present invention, wherein three-dimensional patterns are formed in the masking layer by nano-printing.

FIG. 5a illustrates a substrate 100 surmounted on a masking layer 300. The latter has hollow patterns 301 and protruding patterns 302. All these patterns have been formed by nano-printing of the masking layer 300 by the mould 500. The masking layer 300 comprises adjacent regions having different height levels. The masking layer 300 thus has three-dimensional patterns.

FIG. 5b illustrates an implantation step 400 carried out through the masking layer 300. In this example, the implantation conditions are selected such that the patterns 301, 302 are reproduced with the same dimensions in the substrate 300. This embodiment with isometric transfer of masking patterns is only optional. In this example, the modified zones 110 have different depths.

Figures 5C, 5D:
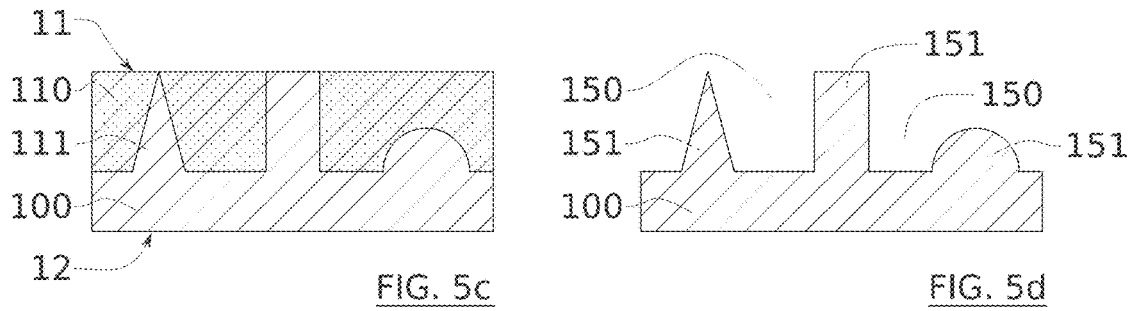

FIG. 5c illustrates the step of removing the masking layer 300.

The substrate 100 then undergoes the electrochemistry step. The implanted zones 110 are made porous selectively at the non-implanted zones 111. Preferably, the zones 110 made porous are automatically detached from the substrate 100 during the electrochemistry step. Alternatively, after the electrochemistry step, a wet cleaning is carried out, in order to etch the porous zones 110 selectively at the zones 111 which have not been made porous.

FIG. 5d illustrates the final result obtained. The method according to the invention thus makes it possible to obtain, easily and reproducibly, a structuring of the front face of the substrate 100, this front face 11 carrying three-dimensional hollow patterns 150 and protruding patterns 151, of which the geometries are possibly complex.

In this embodiment, as in all the other embodiments covered by the claims, the final patterns obtained in the substrate 100 can:
- either conform (in terms of geometry and/or dimensions) with the masking patterns 301, 302 formed in the masking layer 300,
- or be different (in terms of geometry and/or dimensions) from the masking patterns 301, 302 formed in the masking layer 300.

The conformity or non-conformity of the transfer of the patterns from the masking layer 300 to the substrate 100 depends in particular on the respective capacities of the materials thereof to let the ions penetrate within them during the implantation 400.

Below in the description, detailed examples with numerical values will be presented. The current anodisation density will be given by an intensity expressed in amperes. These intensity values have been obtained with substrates forming disks of 200 mm in diameter. A person skilled in the art can thus calculate the current density applied in these examples. It can thus determine the intensity of the current that must be applied for substrates of different dimensions.

Figure 4:
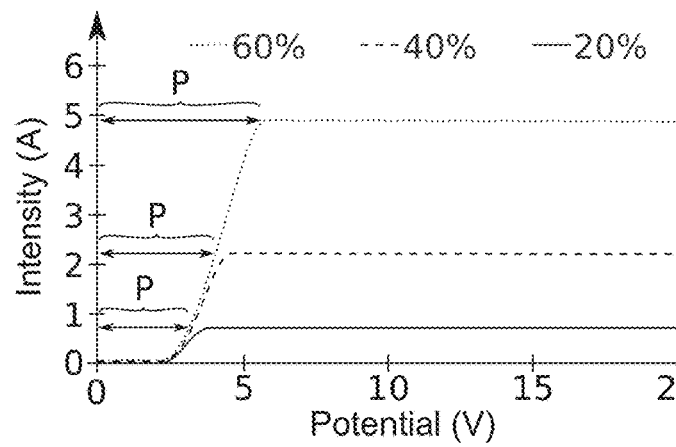
FIG. 4 is a graph illustrating the regimes of porosification and of electropolishing for a substrate made of P-type silicon.

FIG. 4 and the paragraphs below have a protocol example to define conditions for anodising the substrate 100. It is based on this protocol that the conditions mentioned in the specific, but non-limiting examples have been defined, which will be described in reference to FIGS. 6 to 8.

In this non-limiting example, the substrate is a P-type silicon substrate, of which the resistivity is from 1 to 50 ohms (standard resistivity range for p-type silicon plates doped with boron at around 2.6.E14 to 1.5E16 atm/cm$^3$), of which the crystalline orientation is (1 0 0). The substrate has a circular shape (disk) of 200 mm in diameter.

In order to define the conditions of anodising the substrates, three reference plates have been treated in an electrochemical cell, of which the electrolyte is an HF acid diluted to 35%, the solvent being isopropanol (IPA).

The plates are in contact with the chemical bath on the front 11 and rear 12 face. The potential is made to vary from 0 to 20V, the evolution of the current is measured progressively from the treatment, which thus makes it possible to trace the curves illustrated in FIG. 4. Each of the curves corresponds to an illumination rate of 20%, 40% and 60% for a light source which delivers a white light with a maximum power of 3500 W. In the present patent application, the illumination rate of the power delivered by the source is qualified, with respect to the maximum power that the latter can deliver.

The shape of the curves makes it possible to identify the nature of the regime, wherein the substrate is located. This regime is, either a porosification regime (increasing portion of the curve), or an electropolishing regime (portion of the curve having a constant intensity).

Advantageously, the electrochemical conditions are selected so as to be situated in the porosification regime.

The illumination is a white light with a power of 3500 W.

In this example, it is selected to work at 60% illumination, i.e. that the power emitted by the light source is 60% of the maximum power thereof (that is 60% of 3500 W). This increased illumination power has the advantage of increasing the speed of the porosification. Indeed, the higher the illumination rate is, the higher the anodisation speed is. A higher illumination power would be possible, but could potentially lead to increased porosification speeds and therefore to etching speeds which are too rapid, to be controlled stably and reproducibly.

In this example, it is also selected to be placed in the 2 A porosification zone.

The electrochemistry time is defined using a blank silicon plate treated with the same parameters (porosification regime at 60% illumination and at a constant current of 2 A). By studying the evolution of the porosified thickness over time of this control plate, it has been made possible to estimate the time necessary to treat a plate locally implanted at a depth varying between 100 nm and 200 nm.

Several specific, but non-limiting examples will now be described in reference to FIGS. 6 to 8.

FIG. 6 illustrates the etching of two-dimensional patterns in a substrate 100 forming a crystalline silicon plate. The substrate 100 is of P-type. It has a resistivity of 1 to 50 ohms.

In this example, the masking layer 300 is a resin arranged directly in contact with the substrate 100. Prior to the step illustrated in FIG. 6a, a conventional optical lithography is carried out to produce patterns 301 in the form of parallel lines.

Then, an implantation of argon ions is carried out, with the following conditions:

| Nature of the ions | Energy of the ions | Dose |
|---|---|---|
| Argon (Ar) | 100 keV | 1.E16 atm/cm$^3$ |

For this example, it is not necessary to deposit a buffer layer 200.

Figure 6A:
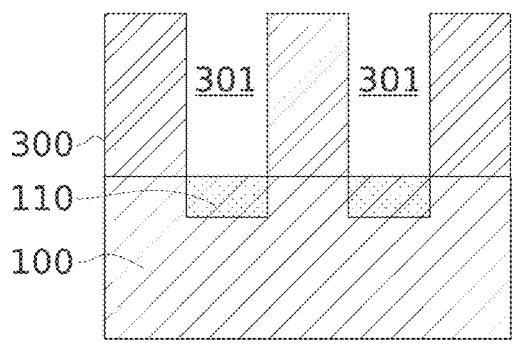
FIG. 6 composed of FIGS. 6a to 6d, illustrates steps of another embodiment of the present invention, wherein two-dimensional patterns are formed in the masking layer.
Figure 6C:
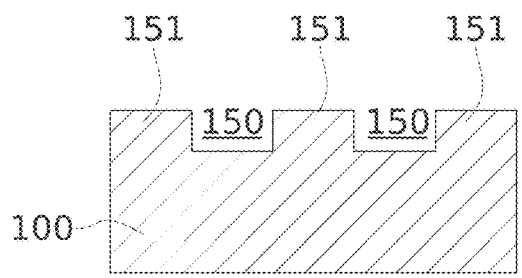
Figure 6B:
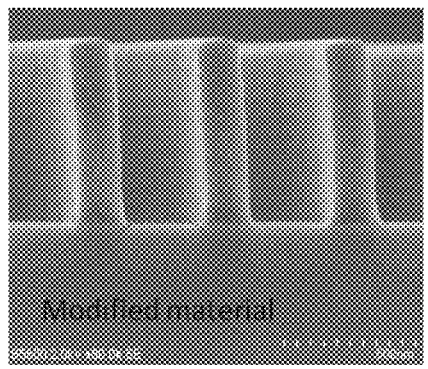

FIGS. 6a and 6b illustrate, respectively schematically and by an electron microscope photograph, the result obtained from the implantation step.

Then, a step of removing the masking layer 300 is carried out. Then, the step of anodising the substrate 100 is carried out with illumination of the rear face 12 of the substrate 100. The electrochemical conditions are as follows:

| Intensity (amperes) | Nature of the electrolyte (base) | Illumination rate (% of maximum power of the source) | Duration of the electrochemistry (seconds) |
|---|---|---|---|
| 2A | HF35% | 60% | 30 s |

For the conditions of this embodiment and those of the following figures, it will be reminded that the values mentioned for the intensities have been obtained with substrates forming disks of 200 mm in diameter. Moreover, it will be reminded that the maximum power of the source, in these examples is 3500 W.

Figure 6D:
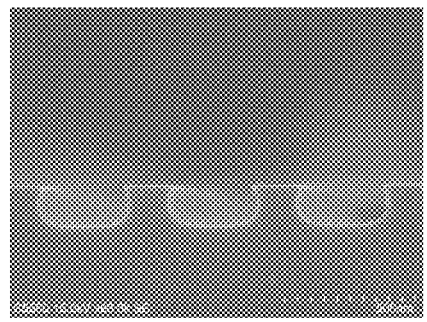

FIGS. 6c and 6d illustrate, respectively schematically, and by an electron microscope photograph, the result obtained from the removal step comprising the electrochemistry.

Particularly advantageously, the zones made porous are themselves detached during the electrochemistry.

For this embodiment, as for all the embodiments, during the electrochemistry step, the following can happen:
- maintaining a constant intensity of the current passing between an anode formed by the substrate 100 and a cathode immersed in the electrolysis,
- monitoring the evolution of the voltage between the anode and the cathode.

If a stabilisation of the intensity or if a variation in intensity of a factor k is thus detected, it is deduced from this that all of the at least one first zone has been made porous.

It will be noted, that it is also possible to proceed conversely, i.e. by fixing the voltage and by monitoring the evolution of the intensity.

Thus, it is possible to precisely control, that the whole modified zone 110 during the implantation has been made porous and has been possibly removed. The electrolysis step can thus be interrupted.

Figure 7A:
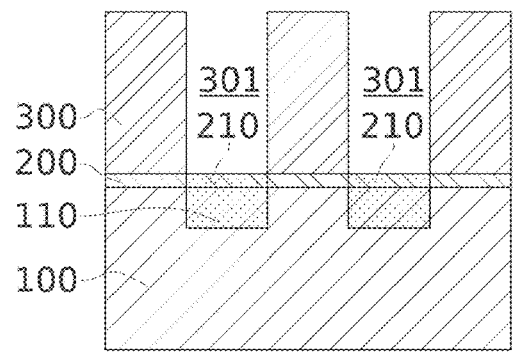
FIG. 7 composed of FIGS. 7a to 7c, illustrates steps of another embodiment of the present invention, wherein a buffer layer is provided between the substrate and the masking layer.
Figure 7B:
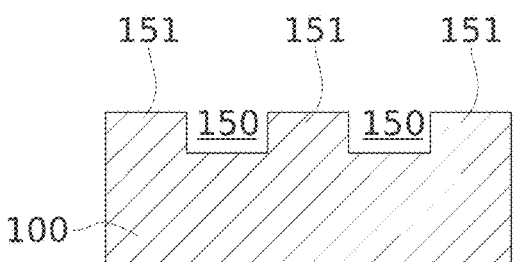

FIG. 7 illustrates the etching of two-dimensional patterns in a substrate 100, identical to that of the preceding example.

The stack of this example differs from that of FIG. 6 in that a buffer layer 200 is arranged between the substrate 100 and the masking layer 300. This buffer layer 200 is formed by a nitride deposition (for example, but in a non-limiting manner of silicon nitride SiN), preferably by LPCVD (low-pressure chemical vapour deposition). The thickness of this layer 200 is 20 nm ($10^{-9}$ metres).

Prior to the step illustrated in FIG. 7a, a conventional optical lithography is carried out to produce the patterns 301 in the form of parallel lines.

Then, an implantation of argon ion is carried out under the following conditions:

| Nature of the ions | Energy of the ions | Dose |
|---|---|---|
| Argon (Ar) | 100 keV | 1.E15 atm/cm³ |

FIG. 7a schematically illustrates the result obtained from the implantation step. The zones 110 of the substrate 100, as well as the zone 210 of the buffer layer 200 situated to the right of the openings 301 of the masking layer 300 are implanted.

Then, a step of removing the masking layer 300 and a step of removing the buffer layer 200 are carried out. Then, the step of anodising the substrate 100 is carried out, with illumination of the rear face 12 of the substrate 100. The electrochemical conditions are as follows:

| Intensity (amperes) | Nature of the electrolyte (base) | Illumination rate (% of maximum power of the source) | Duration of the electrochemistry (seconds) |
|---|---|---|---|
| 2A | HF35% | 40% | 10 s |

Figure 7C:
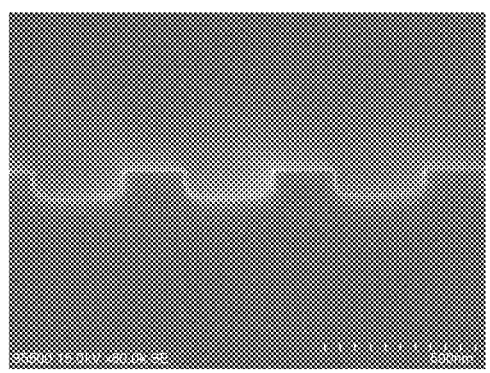

FIG. 7c schematically illustrates the result obtained from the removal step comprising the electrochemistry.

Particularly advantageously, the zones made porous are themselves detached during the electrochemistry.

FIG. 8 illustrates the etching of three-dimensional patterns in a substrate 100, identical to that of the example illustrated in FIG. 6.

In this non-limiting example, the masking layer 300 is a resin arranged directly in contact with the substrate 100, without an intermediate buffer layer 200.

Figure 8A:
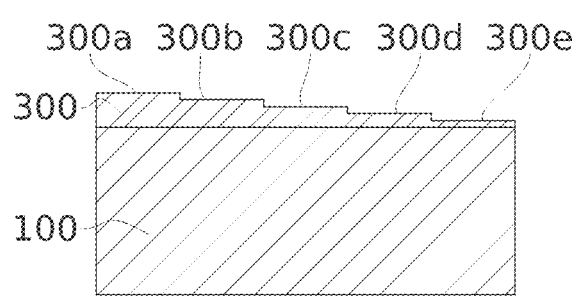
FIG. 8 composed of FIGS. 8a to 8d, illustrates steps of another embodiment of the present invention, wherein a staircase profile is formed.
Figure 8A:
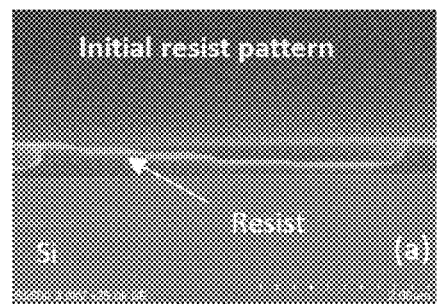

Prior to the step illustrated in FIG. 8a, patterns 300a-300e are produced, which together define a staircase profile. This profile is preferably obtained by nano-printing. Thus, the masking layer 300 has adjacent regions 300a, 300b ( . . . ) of different heights, i.e. of different thicknesses.

Figure 8B:
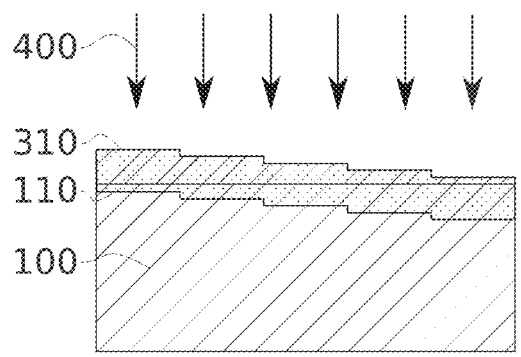

As illustrated in FIG. 8b, then an implantation of argon ions is carried out with the following conditions:

| Nature of the ions | Energy of the ions | Dose |
|---|---|---|
| Argon (Ar) | 150 keV | 1.E16 atm/cm³ |

Implanted zones 110 which are according to patterns 300a to 300e are thus obtained in the substrate 100. The adjacent implanted zones have different implantation depths.

Figure 8C:
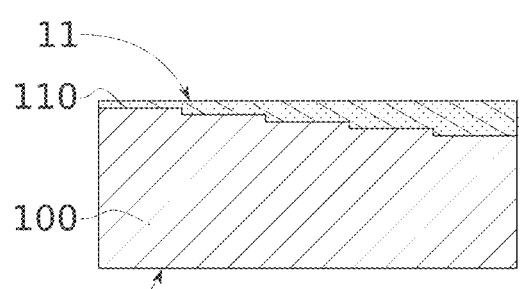
Figure 8C:
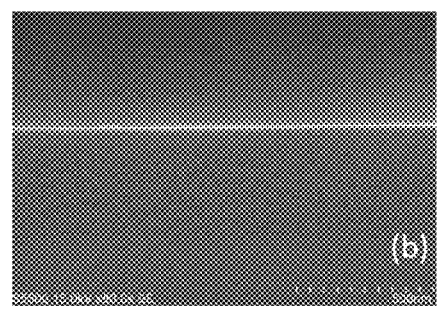

The following step, illustrated in FIG. 8c schematically and by an electron microscopy photograph, consists of removing the masking layer 300.

Then, the step of anodising the substrate 100 is carried out, with illumination of the rear face 12 of the substrate 100. The electrochemical conditions are as follows:

| Intensity (amperes) | Nature of the electrolyte (base) | Illumination rate (% of maximum power of the source) | Duration of the electrochemistry (seconds) |
|---|---|---|---|
| 2A | HF35% | 60% | 30 s |

Figure 8D:
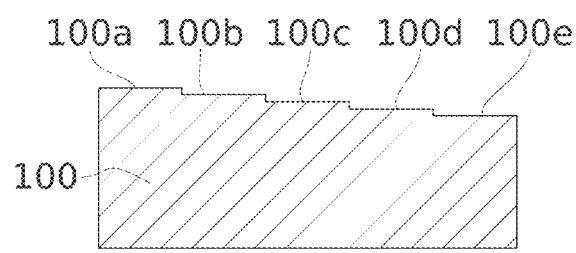
Figure 8D:
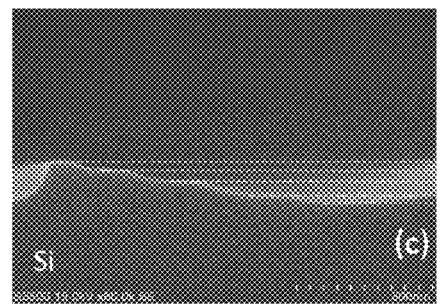

FIG. 8d illustrates schematically, and by an electron microscope photograph, the result obtained from the removal step comprising the electrochemistry. In this FIG. 8d, the substrate 100 has adjacent patterns 100a, 100b ( . . . ) having different depths. A three-dimensional structuring of the front face of the substrate 100 is thus obtained.

Particularly advantageously, the zones made porous are themselves detached during the electrochemistry.

In view of the description above, it appears clearly that the invention proposes a particularly effective solution, to structure in thickness the front face of a substrate by forming on the front face, patterns with possibly complex shapes, with a good dimensional control and with reduced risks of damaging or contaminating layers underlying the substrate that is wanted to be etched. Moreover, the patterns produced in the substrate have the same properties as the substrate at the start of the method.

The present invention therefore proves to be particularly advantageous for producing microelectronic, electronic, micromechanical, electromechanical (MEMS, NEMS, etc.), microfluidic, optical or optoelectronic devices.

The invention is not limited to the embodiments described above, and extends to all embodiments covered by the claims.

The invention claimed is:

1. A method for structuring a front face of a substrate by producing at least one pattern on the front face of the substrate, the method comprising:
providing a substrate having a front face surmounted by at least one masking layer;
defining at least one mask pattern in the masking layer such that the masking layer comprises adjacent regions having different height levels;
producing an ion implantation of the substrate by the front face and at least to the right of the mask pattern, so as to form at least one first zone modified by implantation and at least one second zone not modified by implantation or less modified than the at least one first zone, the implantation conditions being selected such that after implantation, the at least one first zone has a resistivity $\rho 1$ less than a resistivity $\rho 2$ of the at least one second zone;
removing the masking layer such that the front face of the substrate is stripped; and
at least the following successive steps:
after the ion implantation, immersing the substrate in an electrolyte such that the stripped front face of the substrate is fully in contact with the electrolyte, and
removing the at least one first zone selectively at the at least one second zone so as to form on the front face of the substrate, the at least one pattern of which a geometry is according to the mask pattern, said removing comprising at least an application of an electrochemistry step on the substrate to cause a porosification of the at least one first zone selectively at the at least one second zone, said removing being carried out such that at least during the electrochemistry step, at least one rear face of the substrate opposite the front face has charge carriers.

2. The method according to claim 1, wherein the ion implantation is carried out such that $\rho 2 \geq 1.1*\rho 1$.

3. The method according to claim 1, wherein the electrochemistry step is carried out such that the porosification leads to a complete detachment of the at least one first zone with respect to the at least one second zone.

4. The method according to claim 1, wherein the electrochemistry step is carried out such that the porosification does not lead to a complete detachment of the at least one first zone with respect to the at least one second zone, and the removing of the at least one first zone selectively further comprises, after the electrochemistry step, a step of etching the at least one first zone made porous selectively at the at least one second zone.

5. The method according to claim 1,
wherein the ion implantation of the substrate is carried out so as to form several zones modified by implantation, and
wherein the electrochemistry step is carried out such that the porosification:
leads to a complete detachment of only some of said formed several zones with respect to the at least one second zone, and
does not lead to a complete detachment of other first zones with respect to the at least one second zone, and the removing of the at least one first zone selectively further comprises, after the electrochemistry step, a step of etching said other first zones.

6. The method according to claim 1, wherein ions implanted during the ion implantation have an atomic mass greater than an atomic mass of boron.

7. The method according to claim 1, wherein ions implanted during the ion implantation are chosen from among hydrogen (H)-based ions and helium (He)-based ions.

8. The method according to claim 1, wherein the ion implantation of the substrate is carried out such that ions are implanted with an energy less than or equal to 150 keV.

9. The method according to claim 1, wherein the removing the at least one first zone selectively further comprises a selective wet etching of the at least one first zone made porous selectively at the at least one second zone.

10. The method according to claim 9, wherein the wet etching is carried out in an alkaline environment.

11. The method according to claim 10, wherein the wet etching is based on one of the following solutions: potassium hydroxide (KOH) or tetramethylammonium hydroxide (TMAH).

12. The method according to claim 1, wherein the removing the at least one first zone selectively further comprises an illumination of the at least one rear face of the substrate such that the at least one rear face has charge carriers during the electrochemistry step.

13. The method according to claim 12, wherein the illumination is carried out during the electrochemistry step.

14. The method according to claim 1, further comprising, before the immersing the substrate in the electrolyte, a step of doping the at least one rear face such that the at least one rear face has charge carriers during the electrochemistry step.

15. The method according to claim 1, wherein the masking layer is a resin layer, and the step of defining the at least one mask pattern in the masking layer comprises at least one from among: an optical lithography, an electronic lithography, a nano-printing lithography, and a direct self-assembled (DSA) method.

16. The method according to claim 1, wherein during the ion implantation, the substrate is surmounted on a buffer layer situated between the front face of the substrate and the masking layer.

17. The method according to claim 16,
wherein the masking layer comprises carbon atoms, and
wherein the buffer layer is shaped so as to trap the carbon atoms, which would be obtained from the masking layer during the ion implantation.

18. The method according to claim 1, wherein the defining the at least one mask pattern in the masking layer is carried out such that the masking layer comprises at least one first region having a non-zero height level and at least one second region, adjacent to the first region and having a zero height level, said first and second regions defining, in the masking layer, at least one two-dimensional mask pattern.

19. The method according to claim 1, wherein the defining the at least one mask pattern in the masking layer is carried out such that the masking layer comprises at least one first region having a first non-zero height level and at least one second region, adjacent to the first region and having a second non-zero height level and different from the non-zero first height level, said first and second regions defining, in the masking layer, at least one three-dimensional mask pattern.

20. The method according to claim 1, wherein the masking layer is shaped and the ion implantation is carried out so as to form, in the substrate, at least two first adjacent zones and having different and non-zero implantation depths.

21. The method according to claim 1, wherein during the electrochemistry step, a constant intensity of current passing between an anode formed partially at least by the substrate and a cathode immersed in electrolyte is maintained, an evolution of voltage between the anode and the cathode is monitored, and when a stabilization is detected, deducing that all of the at least one first zone has been made porous.

22. The method according to claim 1, wherein said pattern formed on the front face of the substrate from the removal step, has dimensions proportional to those of the mask pattern.

23. The method according to claim 1, configured such that the at least one pattern formed on the front face of the substrate from the removing the at least one first zone selectively is identical to the mask pattern.

24. The method according to claim 1, wherein the ion implantation is carried out such that $\rho 2 \geq 2*\rho 1$.

25. The method according to claim 1, wherein the ion implantation is carried out such that $\rho 2 \geq 3*\rho 1$.

* * * * *